Feb. 6, 1962 M. BYCZKOWSKI 3,020,412

SEMICONDUCTOR PHOTOCELLS

Filed Feb. 20, 1959

MIECZYSLAW BYCZKOWSKI
INVENTOR.

BY

ATTORNEY 3,020,412
Patented Feb. 6, 1962

3,020,412

SEMICONDUCTOR PHOTOCELLS

Mieczyslaw Byczkowski, Chicago, Ill., assignor to Hoffman Electronics Corporation, a corporation of California Filed Feb. 20, 1959, Ser. No. 794,736
5 Claims. (Cl. 250—211)

The present invention relates to semiconductor photocells, and more particularly to p-n junction photoconductive cells such as photodiodes.

Light impinging upon a photodiode in the region of its p-n junction generates electron-hole pairs, thereby changing the conductivity of the junction and changing the resistance of the photodiode. Since the resistance of the photodiode is a function of the intensity of the impinging light, if the photodiode is connected to an external power supply, the incidence of light can be used to control some desired function, such as switching an electrical circuit. The more extensive is the junction surface that is exposed to the light, the greater is the sensitivity of the photodiode. Photodiodes currently in use do not expose much junction surface to the light and are hence insensitive.

It is an object of the present invention, therefore, to provide a novel photodiode.

It is another object of the present invention to provide a sensitive photodiode having an extensive junction surface that can be exposed to impinging light.

According to the present invention, a p-n junction photodiode comprises a semiconductor shaped so as to have a plurality of islands on its diffused surface. The undiffused portion of the semiconductor extends to the surface at each of the islands, so that the junction lying beneath the diffused surface is exposed at each of the islands. By connecting leads to the undiffused body portion of the semiconductor and to the diffused portion between the islands, a photodiode in which a considerable amount of junction surface intersects the top surface of the photodiode is obtained.

The features of the present invention which are believed to be novel are set forth with particularlity in the appended claims. The present invention, both as to its organization and manner of operation, together with further objects and advantages thereof, may best be understood by reference to the following description, taken in connection with the accompanying drawings, in which:

Figure 1:
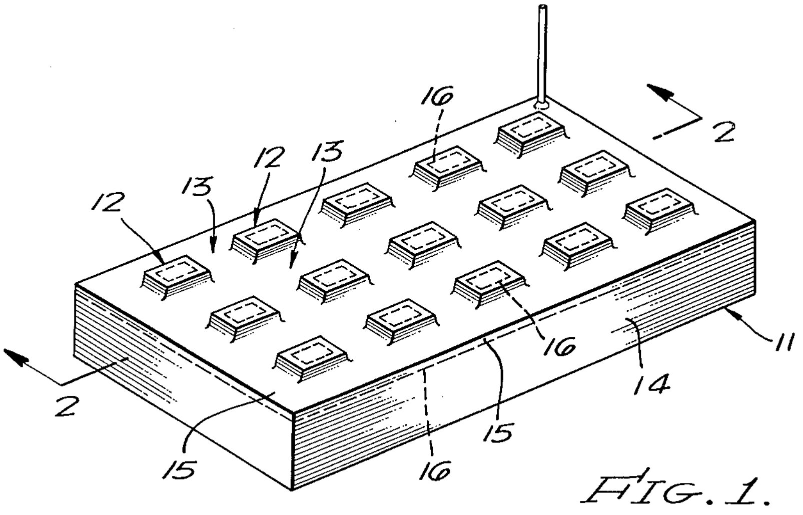
FIGURE 1 is an isometric view of a photodiode embodying the present invention.

Referring now to the drawings, FIGURE 1 shows photodiode 11 having islands 12 separated by channels 13. Body portion 14 is made of silicon, for example, and can be either P-type or N-type, and diffused portion 15 is of the opposite type and separated from body portion 14 by junction 16. The extent of diffused portion 15 can be seen more clearly in FIGURE 2.

Figure 2:
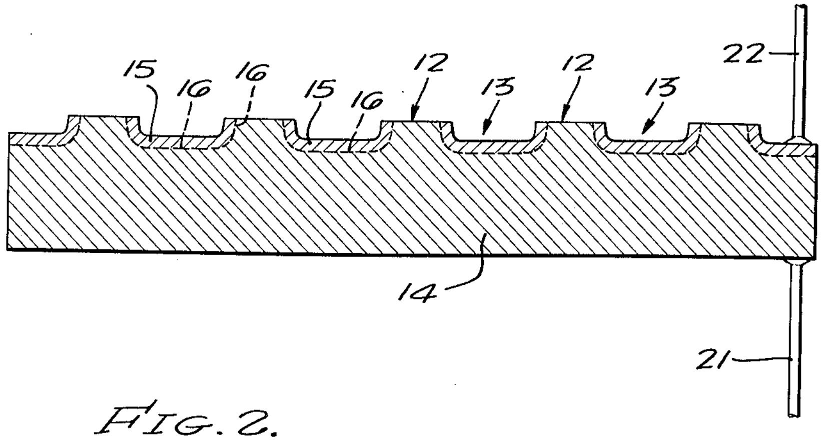
FIGURE 2 is a sectional view taken along line 2—2 of FIGURE 1.

FIGURE 2 shows body portion 14, diffused portion 15, and junction 16. Body portion 14 is connected to lead 21 and diffused portion 15 is connected to lead 22. Islands 12 are shown separated by channels 13. It can be seen from FIGURES 1 and 2 that junction 16 is exposed at the surface of photodiode 11 at each of islands 12, and since the sensitivity of a photodiode is proportional to the extent of the junction surface that is exposed to impinging light, photodiode 12 is very sensitive. The reason for this relationship between junction surface and sensitivity will now be explained.

Light impinging upon the surface of photodiode 14 will generate electron-hole pairs, thus modifying the conductivity of junction 16 and enabling the incidence of light to control some desired function, such as switching an electrical circuit. Defining "diffusion length" as the maximum distance that the generated electrons and holes can diffuse before recombining, only those electrons and holes produced less than a diffusion length away from junction 16 will be able to contribute to the total current. As junction 16 is made more and more extensive, more and more electrons and holes are produced within a diffusion length. Thus, the more junction surface that is exposed to the light, the greater is the sensitivity of a given photodiode. If photodiode 14 is biased in the reverse direction, and if the breakdown voltage is high, substantial amounts of power can be switched by small amounts of photo flux.

In order to obtain the photodiode shown in FIGURES 1 and 2, body portion 14 is shaped, as by etching or ultrasonic shaping, so as to have islands 12 on its surface. This surface is then diffused by a chemical such as phosphorus, if body portion 14 is P-type, or by a chemical such as boron, if body portion 14 is N-type. After diffusion, an abrasive process, such as lapping, is used to remove the diffused layer from the top surface of islands 12, enabling junction 16 to extend to the surfaces of islands 12. If desirable, islands 12 could be masked to protect them against the diffusion gas, or diffused portion 15 could be painted on body portion 14, excluding islands 12, in such a way that no abrasive process would be necessary. Body portion 14 and diffusion layer 15 are then ohmically connected to leads 21 and 22, respectively. To assure a low resistance connection between lead 21 and body portion 14 the lower portion of body portion 14 may have a material of conductivity type the same as body portion 14 diffused into it to form a degenerate layer.

While particular embodiments of the present invention have been shown and described, it will be obvious to those skilled in the art that changes and modifications may be made without departing from this invention in its broader aspects, and, therefore, the aim in the appended claims is to cover all such changes and modifications as fall within the true spirit and scope of this invention.

I claim:

1. A photocell comprising a body of semiconductor material predominantly of one conductivity type having a major surface thereof formed with protuberances extending above the basal plane of said major surface to define spaced-apart islands whose distal surfaces are thus composed of material of said one conductivity type; and a layer of semiconductor material of an opposite conductivity type formed upon the said basal plane of said major surface so as to cover said plane and the peripheral surfaces only of said islands, to define an exposed linear P-N junction adjacent and within the perimeter of the exposed distal surface of each of said islands.

2. A photocell in accordance with claim 1, in which said layer is formed by the diffusion into said body, through said major surface thereof, of a conductivity-type reversing material.

3. A photocell in accordance with claim 1, in which the distal surfaces of all of said protuberances lie substantially in a common plane.

4. A photocell in accordance with claim 1, in which the distal surfaces of all of said protuberances lie substantially in a common plane that is parallel to said basal plane.

5. A photocell in accordance with claim 1, in which said protuberances are arranged in a spaced-apart rectangular matrix array above said basal plane.

References Cited in the file of this patent

UNITED STATES PATENTS

| | | |
|---|---|---|
| 2,588,254 | Lark-Horovitz et al. | Mar. 4, 1952 |
| 2,842,831 | Pfann | July 15, 1958 |
| 2,856,541 | Jacobs | Oct. 14, 1958 |
| 2,875,505 | Pfann | Mar. 3, 1959 |
| 2,886,739 | Matthews et al. | May 12, 1959 |
| 2,892,094 | Lehovec | June 23, 1959 |
| 2,900,523 | Ruzicka | Aug. 18, 1959 |